(12) United States Patent
Kim et al.

(10) Patent No.: US 12,518,982 B2
(45) Date of Patent: Jan. 6, 2026

(54) APPARATUS FOR TREATING SUBSTRATE CONNECTED TO COMMON DUCT

(71) Applicant: SEMES CO., LTD., Cheonan-si (KR)

(72) Inventors: Ju Won Kim, Cheonan-si (KR); Jun Ho Seo, Seoul (KR); Dong Woon Park, Seoul (KR); Sang Pil Yoon, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 696 days.

(21) Appl. No.: 17/563,209

(22) Filed: Dec. 28, 2021

(65) Prior Publication Data

US 2022/0208569 A1    Jun. 30, 2022

(30) Foreign Application Priority Data

Dec. 28, 2020  (KR) .................. 10-2020-0184404

(51) Int. Cl.
*H01L 21/67* (2006.01)
*C23C 16/44* (2006.01)
*H01L 21/687* (2006.01)

(52) U.S. Cl.
CPC .... *H01L 21/67051* (2013.01); *C23C 16/4412* (2013.01); *H01L 21/6715* (2013.01); *H01L 21/6719* (2013.01); *H01L 21/68764* (2013.01); *H01L 21/68792* (2013.01)

(58) Field of Classification Search
None
See application file for complete search history.

(56) References Cited

U.S. PATENT DOCUMENTS

2002/0053319 A1*  5/2002  Nagamine ......... H01L 21/67178
118/52

FOREIGN PATENT DOCUMENTS

| JP | 11283902 | 10/1999 |
|---|---|---|
| JP | H11283902 | 10/1999 |
| JP | 2002-066428 | 3/2002 |
| JP | 2002-261073 | 9/2002 |
| JP | 2013207266 | 10/2013 |
| JP | 2013207266 A | * 10/2013 |
| JP | 2017147415 | 8/2017 |
| KR | 10-2013-0025133 | 3/2013 |
| KR | 1020150039063 | 4/2015 |
| KR | 1020160071010 | 6/2016 |
| KR | 10-2018-0036851 | * 10/2018 |
| WO | 2016052200 | 4/2016 |

* cited by examiner

*Primary Examiner* — Binu Thomas

(57) ABSTRACT

The inventive concept provides a substrate treating apparatus. According to the inventive concept, the substrate treating apparatus treats the substrate by supplying a treating liquid on a rotating substrate. The exhaust unit exhausting an atmosphere of an inner space comprises: a first exhaust port introducing the atmosphere of the inner space, a first exhaust line provided to exhaust an atmosphere introduced through the first exhaust port in a first direction and a second exhaust port introducing the atmosphere of the inner space, and a second exhaust line provided to exhaust an atmosphere introduced through the second exhaust port in a second direction. The controller controls the support unit so an exhaust direction inside of the first exhaust line and the second exhaust line become a forward direction with respect to a rotation direction of the substrate.

6 Claims, 14 Drawing Sheets

APPARATUS FOR TREATING SUBSTRATE CONNECTED TO COMMON DUCT

CROSS-REFERENCE TO RELATED APPLICATIONS

A claim for priority under 35 U.S.C. § 119 is made to Korean Patent Application No. 10-2020-0184404 filed on Dec. 28, 2020, in the Korean Intellectual Property Office, the entire contents of which are hereby incorporated by reference.

BACKGROUND

Embodiments of the inventive concept described herein relate to an apparatus and method for treating a substrate, and more particularly, relate to an apparatus and method for treating a substrate by supplying a liquid onto the rotating substrate.

Various processes such as a photolithography process, an etching process, an ashing process, a thin film deposition process, and a cleaning process are carried out to manufacture a semiconductor device or a flat plate display panel. Among these processes, the photolithography process includes supplying a photoresist to a semiconductor substrate to form a photoresist film on a surface of the substrate, exposing the photoresist film using a photomask, and then supplying a developing liquid to selectively remove portions of the photoresist film.

FIG. 1 is a cross-sectional view schematically illustrating a substrate treating apparatus for applying a photoresist to a substrate, and FIG. 2 is a plan view schematically illustrating an arrangement of an exhaust unit coupled to a treating container in the substrate treating apparatus of FIG. 1. Referring to FIG. 1 and FIG. 2, the substrate treating apparatus 900 includes a treating container 920 having an inner space 901, a support unit 940 supporting the substrate W in the inner space 901, and a nozzle 980 supplying a photoresist onto the substrate W placed on the support unit 940.

The exhaust unit 960 is coupled to a bottom wall of the treating container 920, and the exhaust unit 960 exhausts an atmosphere of the inner space 901 of the treating container 920. The exhaust unit 960 has a first exhaust line 962, a second exhaust line 964, and a common duct 966. The first exhaust line 962 exhausts the atmosphere of the inner space 901 of the treating container 920 through the first exhaust port 961, and the second exhaust line 964 exhausts the atmosphere of the inner space 901 of the treating container 920 through the second exhaust port 963. The first exhaust line 962 and the second exhaust line 964 are connected to the common duct 966, and the atmosphere exhausted from the inner space 901 through the first exhaust port 961 and the second exhaust port 963 flows to the common duct 966.

FIG. 3 illustrates an exhaust state of the atmosphere of the inner space 901 of the treating container 920 when treating the substrate using the substrate treating apparatus 900 of FIG. 1. Referring to FIG. 3, when the substrate (or the support unit) rotates clockwise while supplying the photoresist to treat the substrate, the first exhaust line 962 is disposed to exhaust in a forward direction with respect to a rotation direction of the substrate, but the second exhaust line 964 is disposed to exhaust in a reverse direction with respect to the rotation direction of the substrate. Accordingly, the atmosphere is smoothly exhausted through the first exhaust port 961, but the atmosphere through the second exhaust port 963 is not smoothly exhausted due to generation of a vortex near the second exhaust port 964. Accordingly, an amount of exhaust exhausted through the second exhaust port 963 is smaller than an amount of exhaust exhausted through the first exhaust port 961.

In this case, the amount of exhaust is deviated between a region in which the first exhaust port 961 is provided and a region in which the second exhaust port 963 is provided in the inner space 901, which affects a uniformity of the coating film thickness of the photoresist between the regions of the substrate.

In addition, as an exhaust flowing through the first exhaust line 962 and an exhaust flowing through the second exhaust line 964 collide with each other at a point where the first exhaust line 962 and the second exhaust line 964 are connected to the common duct 966, a flow resistance increases, and the atmosphere is not exhausted from the inner space 901 of the treating container 920 at the predetermined volume thus a process error occurs.

SUMMARY

Embodiments of the inventive concept provide a substrate treating apparatus for improving efficiency in treating a substrate.

Embodiments of the inventive concept provide a substrate treating apparatus for smoothly exhausting an air flow in an inner space when treating a substrate by supplying a treating liquid onto the rotating substrate in the inner space.

Embodiments of the inventive concept provide a substrate treating apparatus for forming a liquid film having a uniform thickness on the entire region of a substrate by supplying a treating liquid onto the rotating substrate.

The technical problems to be solved by the inventive concept are not limited to the aforementioned problems, and any other technical problems not mentioned herein will be clearly understood from the following description by those skilled in the art to which the inventive concept pertains.

An embodiment of the inventive concept provides a substrate treating apparatus. The apparatus comprises: a treating container having an inner space; a support unit supporting and rotating the substrate in the inner space; and an exhaust unit coupled to the treating container and exhausting an atmosphere of the inner space, wherein the exhaust unit comprises: a first exhaust line having a first exhaust port introducing the atmosphere of the inner space, the first exhaust line provided to exhaust an atmosphere introduced through the first exhaust port; and a second exhaust line having a second exhaust port introducing the atmosphere of the inner space, the second exhaust line provided to exhaust an atmosphere introduced through the second exhaust port, and based on a virtual linear line passing the first exhaust port and the second exhaust port when seen from above, the first exhaust line exhausts an atmosphere in a direction facing a side of the linear line, and the second exhaust line exhausts an atmosphere in a direction facing another side of the linear line.

In an embodiment, the apparatus further comprises a controller controlling the support unit, the controller controlling the support unit so an exhaust direction inside of the first exhaust line and the second exhaust line become a forward direction with respect to a rotation direction of the substrate.

In an embodiment, the first exhaust line and the second exhaust line are provided in a circular arc shape, respectively.

In an embodiment, the support unit comprises: a support plate supporting the substrate; a drive shaft coupled to the support plate; and a driver rotating the drive shaft, and the first exhaust line and the second exhaust line having a point symmetry with respect to a rotation center of the support plate when seen from above.

In an embodiment, the first exhaust line and the second exhaust line are coupled to a bottom wall of the treating container.

In an embodiment, the apparatus further comprises a liquid supply unit supplying a treating liquid to the substrate supported by the support unit.

An embodiment of the inventive concept provides a substrate treating apparatus. The apparatus comprises: a first treating unit for treating the substrate including a first treating container having a first inner space and a first support unit supporting and rotating the substrate in the first inner space; a second treating unit for treating the substrate including a second treating container having a second inner space and a second support unit supporting and rotating the substrate in the second inner space; and an exhaust unit exhausting the first inner space and the second inner space, wherein the first treating unit and the second treating unit are arranged in a row, and the exhaust unit comprises: a first common duct located at a side of a unit arrangement direction based on the unit arrangement direction of the first treating unit and the second treating unit; a second common duct located at another side of the unit arrangement direction; a first exhaust line having a first exhaust port introducing an atmosphere of the first inner space and exhausting an atmosphere introduced into the first exhaust port through the first common duct; a second exhaust line having a second exhaust port introducing an atmosphere of the first inner space and exhausting an atmosphere introduced into the second exhaust port through the second common duct; a third exhaust line having a third exhaust port introducing an atmosphere of the first inner space and exhausting an atmosphere introduced into the third exhaust port through the first common duct; and a fourth exhaust line having a fourth exhaust port introducing an atmosphere of the second inner space and exhausting an atmosphere into the fourth exhaust port through the second common duct.

In an embodiment, the apparatus further comprises a controller controlling the first support unit and the second support unit, the controller controlling the first support unit and the second support unit so an exhaust direction inside of the first exhaust line, the second exhaust line, the third exhaust line, and the fourth exhaust line become a forward direction with respect to a rotation direction of the substrate.

In an embodiment, the first exhaust line, the second exhaust line, the third exhaust line, and the fourth exhaust line are provided in a circular arc shape, respectively.

In an embodiment, the first support unit comprises: a first support plate supporting the substrate; a first drive shaft coupled to the first support plate; and a first driver rotating the first drive shaft, wherein the first exhaust line and the second exhaust line have a point symmetry with respect to a rotation center of the first support plate when seen from above, and the second support unit comprises: a second support plate supporting the substrate; a second drive shaft coupled to the second support plate; and a second driver rotating the second drive shaft, wherein the third exhaust line and the fourth exhaust line have a point symmetry with respect to a rotation center of the second support plate when seen from above.

In an embodiment, the first exhaust port, the second exhaust port, the third exhaust port, the fourth exhaust port are sequentially aligned in the unit arrangement direction.

In an embodiment, the controller controls the first support unit and the second support unit so a substrate supported by the first support unit and a substrate supported by the second support unit have a same rotation direction.

In an embodiment, the apparatus further comprises a liquid supply unit discharging a liquid on the substrate, wherein the liquid supply unit comprises: a nozzle; and a nozzle driver moving the nozzle to a first process position facing the first supply unit or a second process position facing the second support unit so the nozzle discharges the liquid to a chosen substrate among a substrate supported by the first support unit or a substrate supported by the second support unit.

An embodiment of the inventive concept provides a substrate treating apparatus. The apparatus comprises: a treating container having an inner space; a support unit supporting and rotating the substrate in the inner space; an exhaust unit coupled to the treating container and exhausting an atmosphere of the inner space, and a controller controlling the support unit, wherein the exhaust unit comprises: a first exhaust line having a first exhaust port introducing the atmosphere of the inner space, the first exhaust line provided to exhaust an atmosphere introduced through the first exhaust port in a first direction; a second exhaust line having a second exhaust port introducing the atmosphere of the inner space, the second exhaust line provided to exhaust an atmosphere introduced through the second exhaust port in a second direction; and a controller controlling the support unit so an exhaust direction inside of the first exhaust line and the second exhaust line become a forward direction with respect to a rotation direction of the substrate.

In an embodiment, the first exhaust port and the second exhaust port have a circular arc shape when seen from above, respectively.

In an embodiment, the support unit comprises: a support plate supporting the substrate; a drive shaft combining with the support plate; and a driver rotating the drive shaft; wherein the first exhaust line and the second exhaust line have a point symmetry with respect to a rotation center of the support plate when seen from above.

An embodiment of the inventive concept provides a substrate treating method. The method comprises: treating a substrate using a substrate treating apparatus comprising a treating container having an inner space, a supply unit supporting and rotating the substrate in the inner space, an exhaust unit coupled to the treating container and exhausting an atmosphere of an inner space, and a liquid supply unit supplying a treating liquid to the substrate supported by the support unit; exhausting the atmosphere of the inner space through each exhaust port of a plurality of exhaust lines while the substrate is treated by supplying a treating liquid on the substrate; and rotating the substrate so an exhaust direction inside of each exhaust line become a forward direction with respect to a rotation direction of the substrate.

In an embodiment, each exhaust line is provided in a circular arc shape, respectively.

In an embodiment, a rotation speed of the substrate is 2000 rpm or higher.

In an embodiment, the treating liquid is a photoresist.

According to the inventive concept, a treating liquid is supplied to a substrate rotating in an inner space of a treating container to smoothly exhaust an air flow in the inner space when the substrate is treated.

According to some embodiments of the inventive concept, when a treating liquid is supplied to a rotating substrate to form a liquid film on the substrate, the thickness of the liquid film may be uniformly formed in the entire region of the substrate.

The effects of the inventive concept are not limited to the above-described effects, and effects not mentioned will be clearly understood by those skilled in the art from the present specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
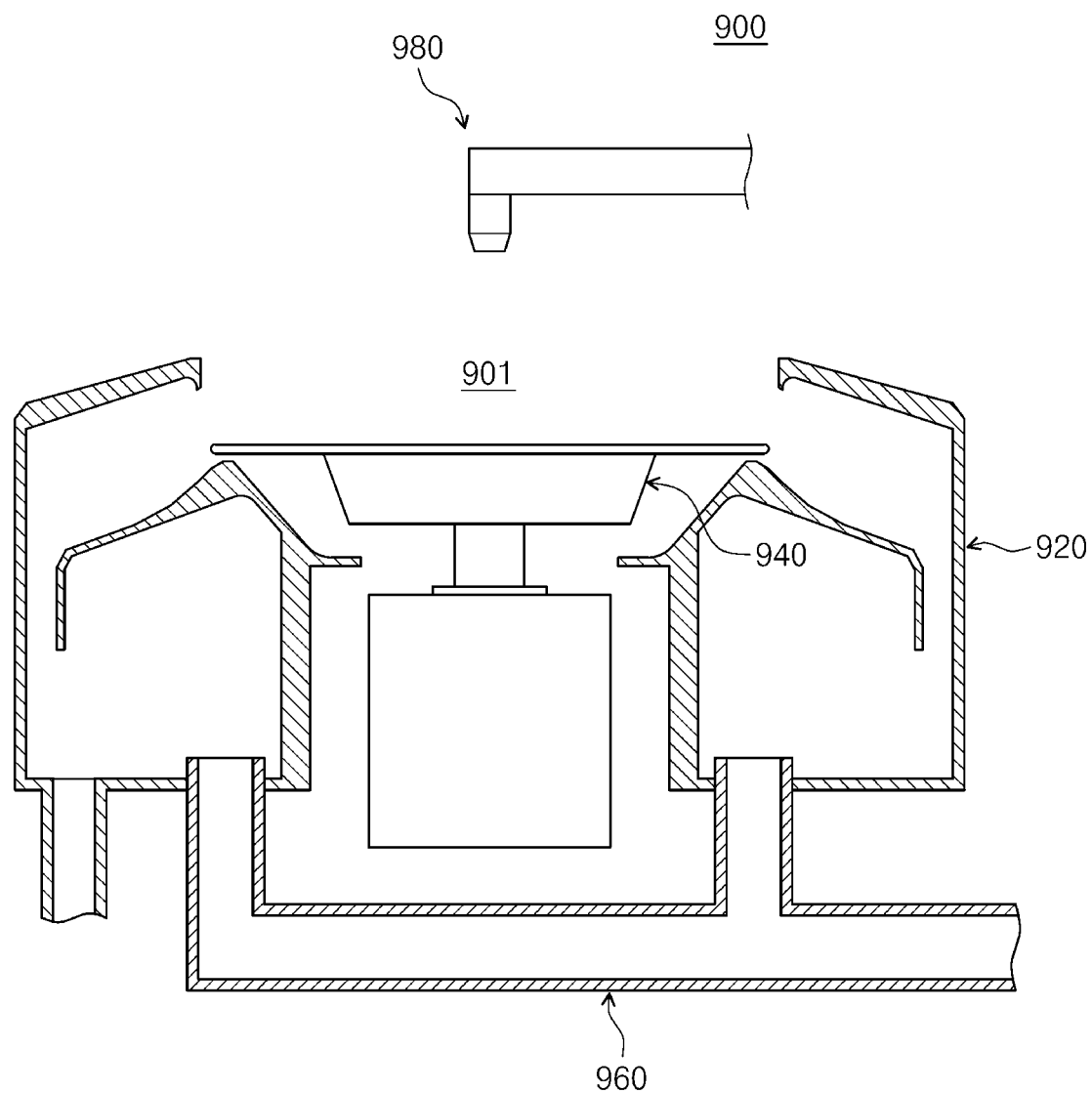
FIG. 1 is a sectional view illustrating a substrate treating apparatus having a general structure for performing a liquid treatment on a substrate while rotating the substrate.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be exaggerated or omitted when it may make the essence of the inventive concept unclear.

An apparatus of this embodiment may be used to perform a photolithography process on a circular substrate. In particular, the apparatus of this embodiment may be connected to an exposure apparatus and may be used to perform a coating process of coating a photoresist on the substrate. However, the spirit and scope of the inventive concept is not limited thereto, and the apparatus may be used to perform various types of processes of supplying a treating liquid aside from a photoresist onto a substrate while rotating the substrate. For example, the treating liquid may be a developing liquid, a chemical, a rinsing liquid, or an organic solvent. Also, the inventive concept may be applied to a process of rotating a substrate while exhausting a space providing the substrate, without supplying a treating liquid.

Hereinafter, an embodiment of the inventive concept will be illustrated with reference to FIG. 4 to FIG. 17.

Figure 4:
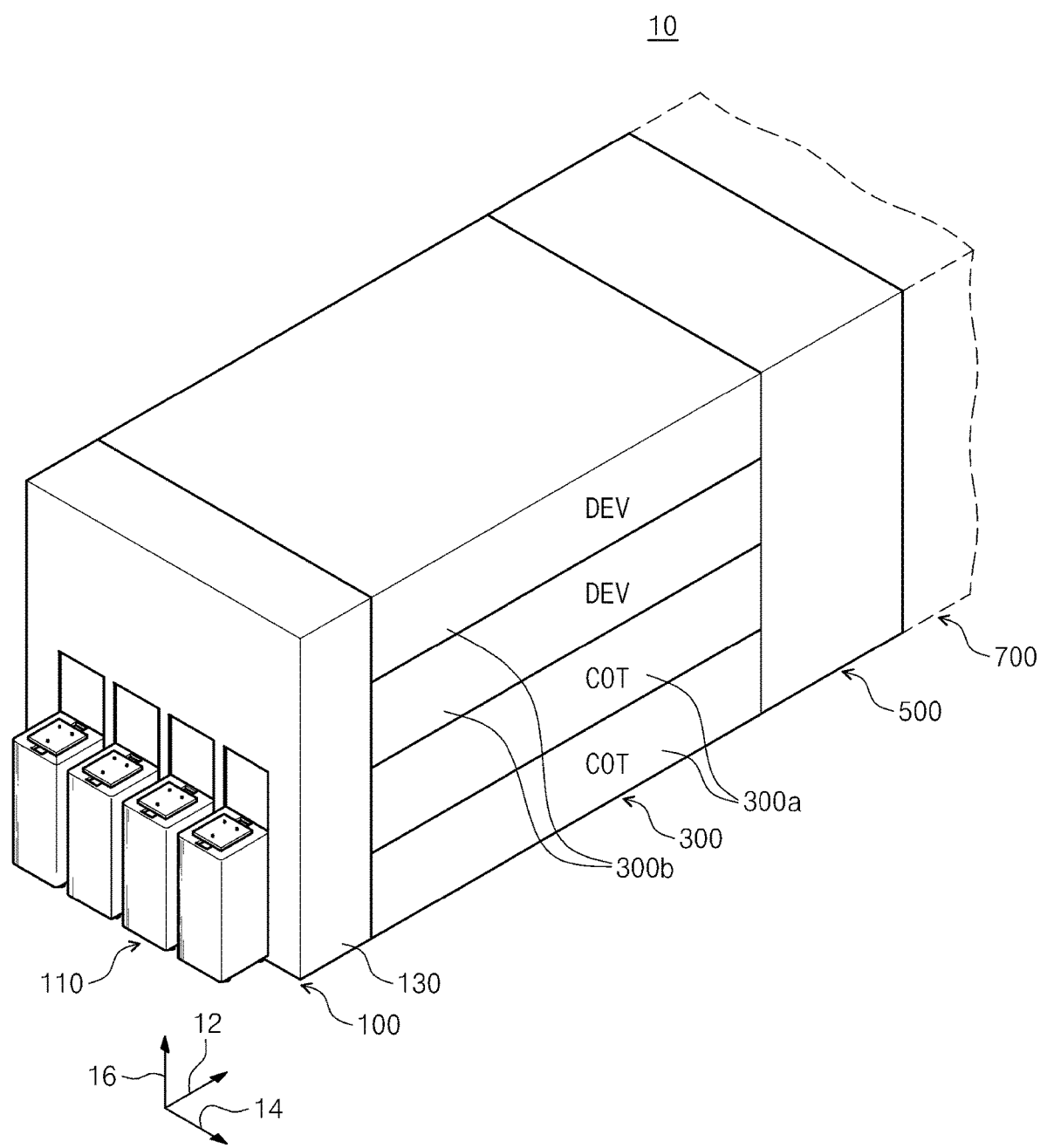
FIG. 4 is a schematic perspective view illustrating the substrate treating apparatus according to an embodiment of the inventive concept.
Figure 5:
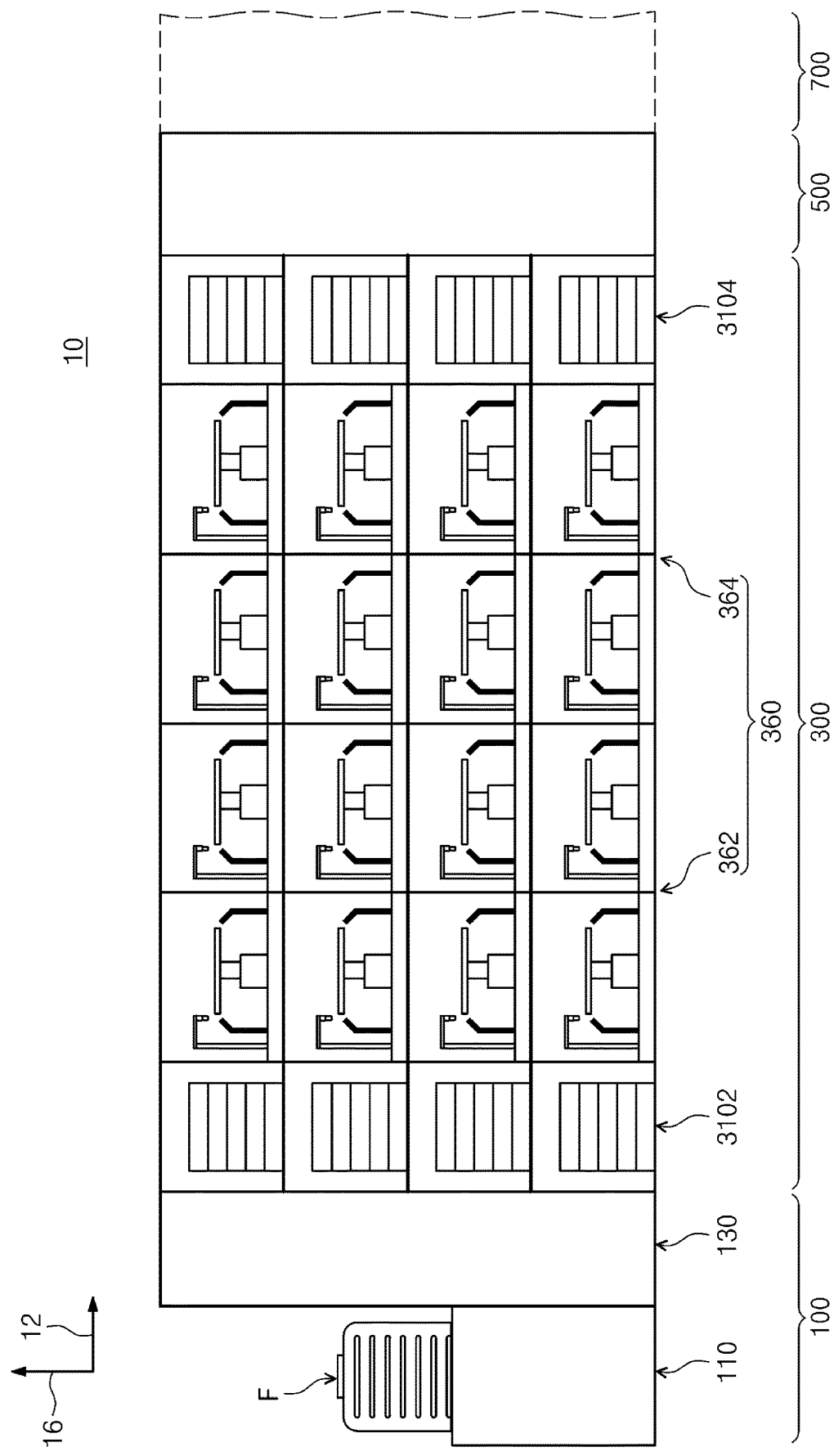
FIG. 5 is a sectional view of the substrate treating apparatus illustrating coating blocks and developing blocks of FIG. 4.
Figure 6:
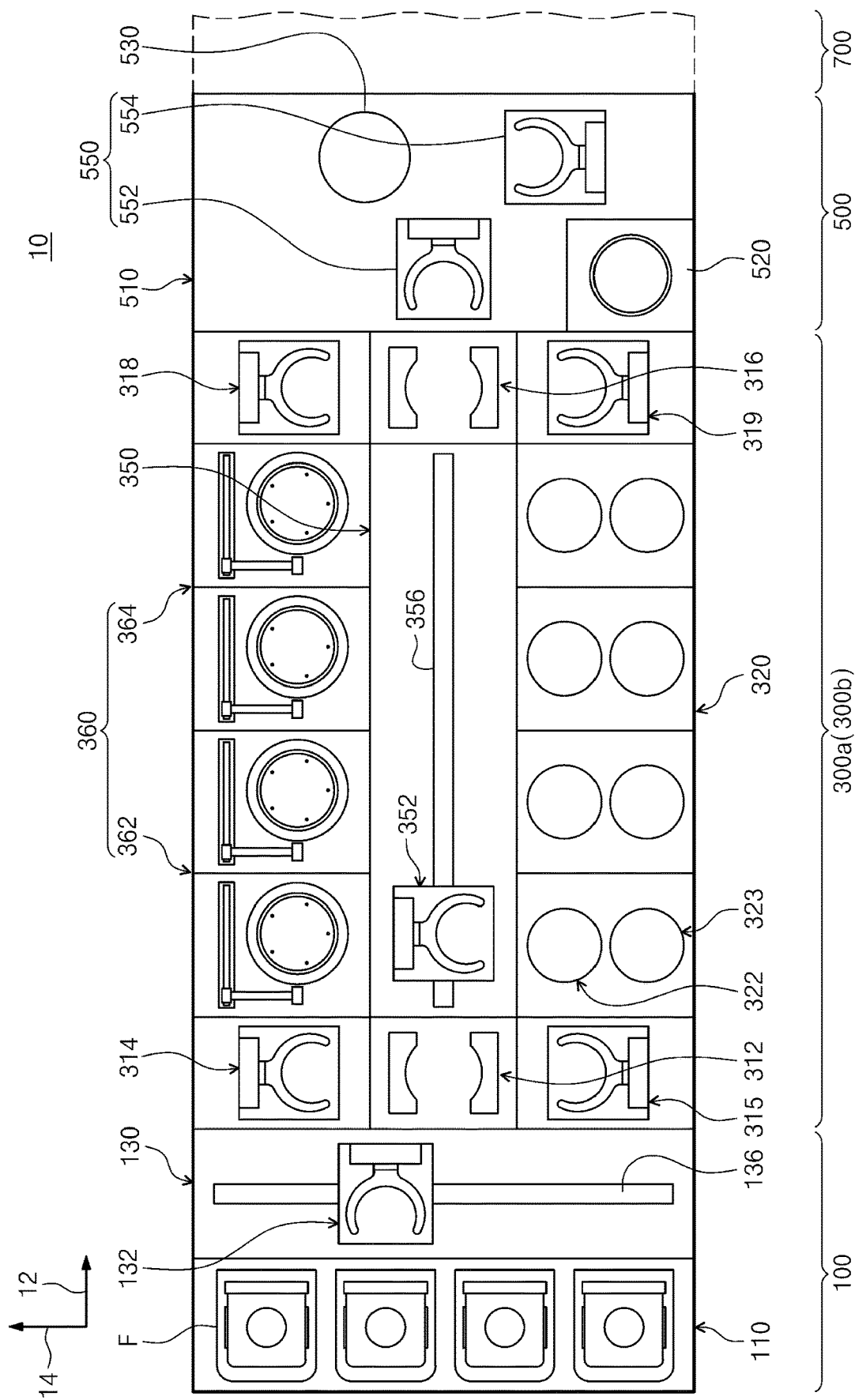
FIG. 6 is a plan view of the substrate treating apparatus of FIG. 4.

FIG. 4 illustrates a substrate treating apparatus according to an embodiment of the inventive concept, FIG. 5 illustrates a coating block or a developing block of FIG. 4, and FIG. 6 shows the substrate treating apparatus of FIG. 4.

Referring to FIG. 4 to FIG. 6, the substrate treating apparatus 10 according to an embodiment of the inventive concept comprises an index module 100, a treating module 300, and an interface module 500. According to an embodiment, the index module 100, the treating module 300, and the interface module 500 are sequentially arranged in a row. Hereinafter, a direction in which the index module 100, the treating module 300, and the interface module 500 are arranged will be referred to as a first direction 12, a direction that is perpendicular to the first direction when viewed from above will be referred to as a second direction 14, and a direction that is perpendicular to both the first direction 12 and the second direction 14 will be referred to as a third direction 16.

The index module 100 transfers the substrate W from the container F in which the substrate W is stored to the treating module 300, and gets the processed substrate W from the treating module 300 to be stored in the container F. The index module 100 is provided with its length extending along the second direction 14. The index module 100 has a load port 110 and an index frame 130. The index frame 130 is placed between the load port 110 and the treating module 300. The container F in which the substrates W are stored is placed at the load port 110. A plurality of load ports 110 may be provided, and the plurality of load ports 110 may be placed along the second direction 14.

For the container F, a closing-type container F such as a front open unified pod (FOUP) can be used. The container F can be placed on the load port 110 by a transfer means (not shown) such as an overhead transfer, an overhead conveyor, or an automatic guided vehicle, or the container F may be placed on the load port 110 by an operator.

An index robot 132 is provided inside the index frame 130. In the index frame 130, a guide rail 136 is provided with its length extending along the second direction 14, and the index robot 132 may be provided movable on the guide rail 136. The index robot 132 includes a hand on which the substrate W is placed, and the hand may be provided to be forwardly and backwardly movable, rotatable with the third direction 16 as an axis, and movable along the third direction 16.

The treating module 300 may perform a coating process and a developing process on the substrate W. The treating module 300 may receive the substrate W stored in the container F and perform a substrate treating process. The treating module 300 has a coating block 300a and a developing block 300b. The coating block 300a performs a coating process on the substrate W, and the developing block 300b performs a developing process on the substrate W. A plurality of the coating blocks 300a are provided, and the plurality of coating blocks 300a are provided to be stacked one above another. A plurality of the developing blocks 300b are provided, and the plurality of developing blocks 300b are provided to be stacked one above another. According to an embodiment of FIG. 4, two coating blocks 300a are provided, and two developing blocks 300b are provided. The coating blocks 300a may be disposed under the developing blocks 300b. In an embodiment, the two coating blocks 300a perform the same process and may be provided in the same structure. In addition, the two developing blocks 300b perform the same process and may be provided in the same structure.

Referring to FIG. 6, the coating block 300a includes a heat treatment chamber 320, a transfer chamber 350, a liquid treating chamber 360, and buffer chambers 312 and 316. The heat treatment chamber 320 may be chambers for performing a heat treatment process on the substrate W. The heat treatment process may include a cooling process and a heating process. The liquid treating chamber 360 supplies liquid onto the substrate W to form a liquid layer. The liquid layer may be a photoresist film or an anti-reflection film. The transfer chamber 350 transfers the substrate W between the heat treatment chamber 320 and the liquid treating chamber 360 in the coating block 300a.

The transfer chamber 350 is provided is provided such that its lengthwise direction is parallel to an up/down direction. A transfer robot 352 is provided in the transfer chamber 350. The transfer robot 352 transfers the substrate among the heat treatment chamber 320, the liquid treating chamber 360, and the buffer chambers 312 and 316. In an embodiment, the transfer robot 352 has a hand on which the substrate W is placed, and the hand may be provided to be forwardly and backwardly movable, rotatable with the third direction 16 as an axis, and movable along the third direction 16. A guide rail 356 is provided in the transfer chamber 350 such that its lengthwise direction is parallel to the first direction, and the transfer robot 352 may be provided to be movable on the guide rail 356.

Figure 7:
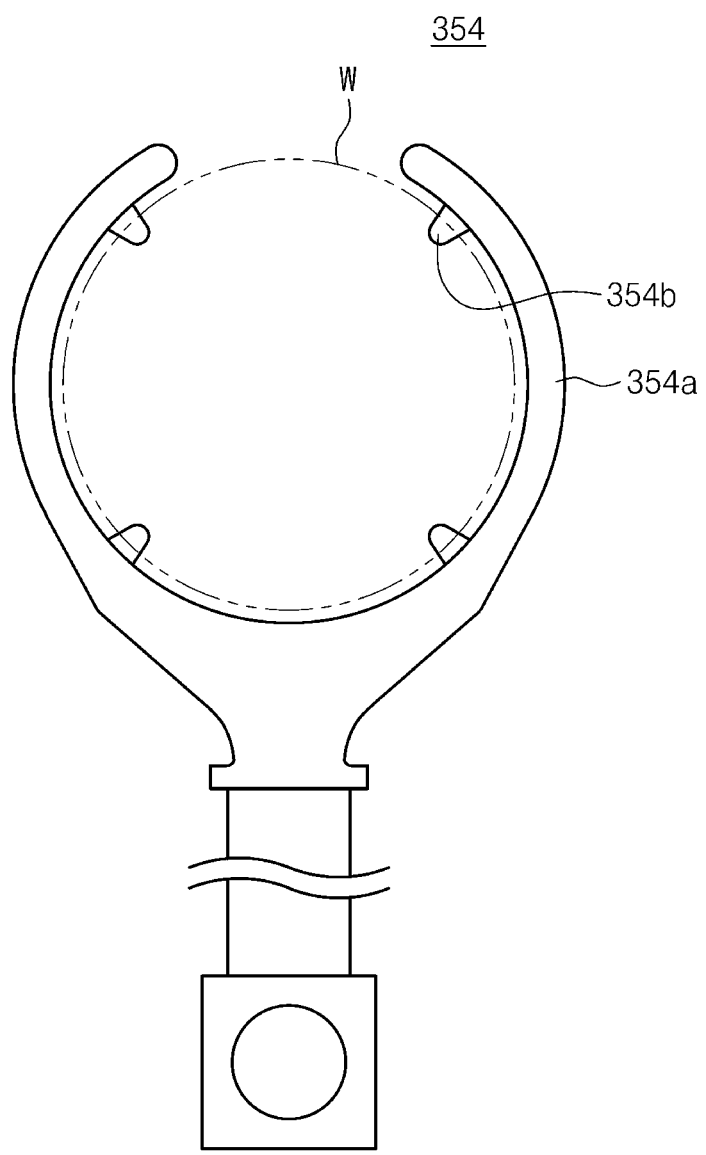
FIG. 7 is a schematic plan view illustrating a transfer robot of FIG. 6.

FIG. 7 illustrates an example of a hand 354 of a transfer robot 352. Referring to FIG. 7, the hand 354 has a base 354a and a support protrusion 354b. The base 354a may have an annular ring shape in which a part of the circumference is bent. The base 354a has an inner diameter larger than the diameter of the substrate W. The support protrusion 354b extends inward from the base 354a. A plurality of support protrusions 354b are provided and support an edge region of the substrate W. According to an embodiment, four support protrusions 354b may be provided at equal intervals.

A plurality of heat treatment chambers 320 are provided. The heat treatment chambers 320 are arranged along the first direction 12. The heat treatment chambers 320 are placed on one side of the transfer chamber 350.

Figure 8:
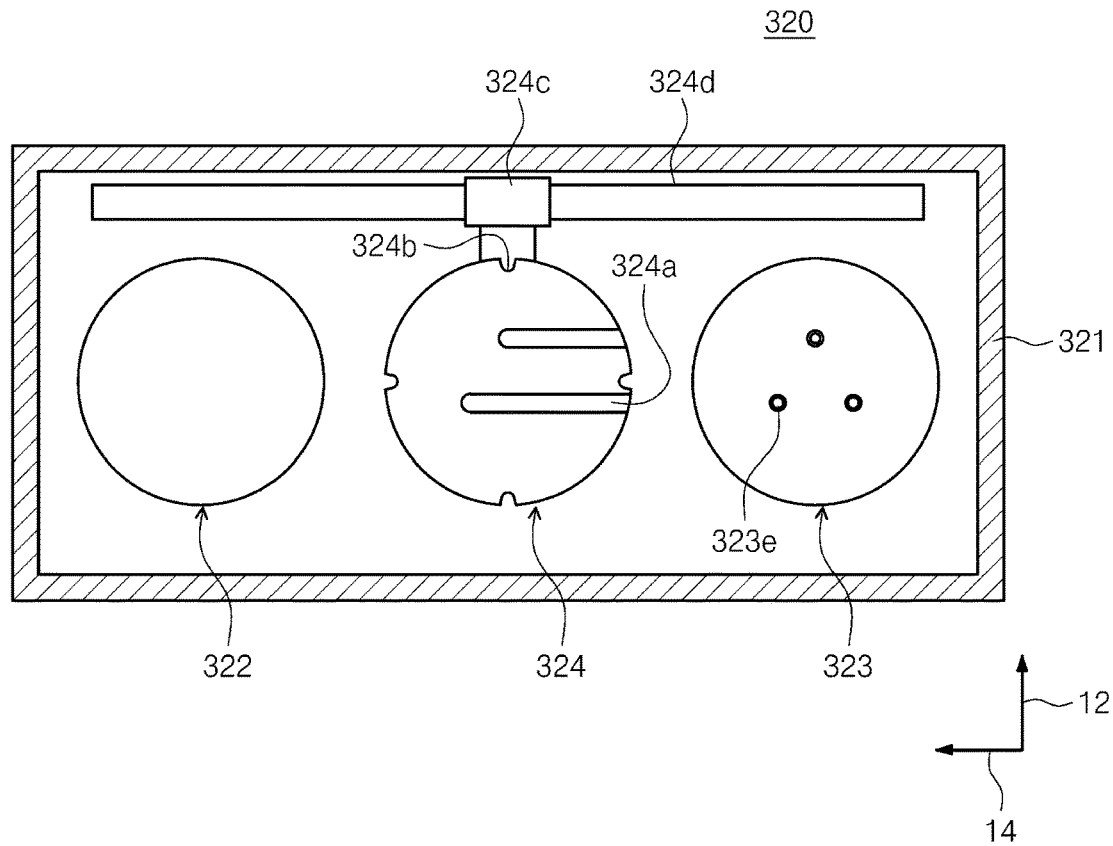
FIG. 8 is a schematic plan view illustrating one example of heat treatment chambers of FIG. 6.
Figure 9:
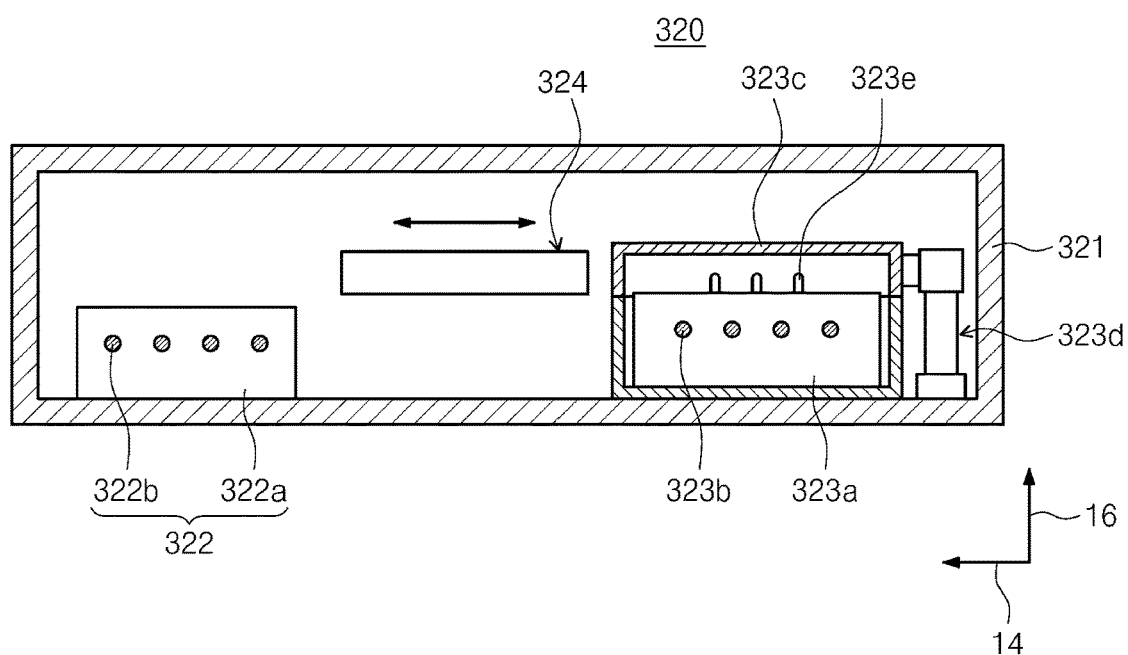
FIG. 9 is a front view of the heat treatment chamber of FIG. 6.

FIG. 8 shows the heat treatment chamber of FIG. 7, and FIG. 9 shows the heat treatment chamber of FIG. 8 according to an embodiment of the inventive concept.

Referring to FIG. 8 and FIG. 9, the heat treatment chamber 320 includes a housing 321, a cooling unit 322, a heating unit 323, and a transfer plate 324.

The housing 321 is provided in a substantially rectangular parallelepiped shape. An inlet part (not shown) through which the substrate W enters and exits is provided on the sidewall of the housing 321. The inlet part may remain open. Selectively, a door (not shown) may be provided to open and close the inlet part. The cooling unit 322, the heating unit 323, and the transfer plate 324 are provided in the housing 321. The cooling unit 322 and the heating unit 323 are provided along the second direction 14. In an embodiment, the cooling unit 322 may be placed closer to the transfer chamber 350 than the heating unit 323.

The cooling unit 322 has a cooling plate 322a. The cooling plate 322a may have a substantially circular shape when viewed from above. The cooling plate 322a is provided with a cooling member 322b. In an embodiment, the cooling member 322b is formed inside the cooling plate 322a and may be provided as a passage through which the cooling fluid flows. The heating unit 323 has a heating plate 323a, a cover 323c, and a heater 323b. The heating plate 323a has a generally circular shape when viewed from above. The heating plate 323a has a larger diameter than the substrate W. The heating plate 323a is equipped with a heater 323b. The heater 323b may be implemented with a resistance heating element to which an electric current is applied. The heating plate 323a is provided with lift pins 323e that may be vertically movable along the third direction 16. The lift pins 323e receive the substrate W from the transfer means outside the heating unit 323 and place the substrate W down on the heating plate 323a or raise the substrate W off the heating plate 323a and transfer the substrate W to the transfer means outside the heating unit 323. In an embodiment, three lift pins 323e may be provided. The cover 323c has a space therein, which is open at the bottom.

The cover 323c is disposed above the heating plate 323a and is moved in the up/down direction by the driver 3236d. A space formed by the cover 323c and the heating plate 323a by moving the cover 323c is provided as a heating space for heating the substrate W.

The transfer plate 324 has a substantially circular shape and has a diameter corresponding to that of the substrate W. A notch 324b is formed at an edge of the transfer plate 324. The notch 324b may have a shape corresponding to the protrusion 3543 formed on the hand 354 of the transfer robot 352. In addition, as many notches 324b as the protrusion 3543 formed on the hand 354 are formed in a position corresponding to the protrusions 3543. When the vertically aligned positions of the hand 354 and the transfer plate 324 are changed in the vertical direction, the substrate W is transferred between the hand 354 and the transfer plate 324. The transfer plate 324 may be mounted on the guide rail 324d and is movable along the guide rail 324d by the driver 324c between a first region and a second region. A plurality of guide grooves 324a in a slit shape are provided in the transfer plate 324. The guide grooves 324a inwardly extends from the edge of the transfer plate 324 into the inside of the transfer plate 324. The guide grooves 324a are provided with their length extending along the second direction 14, and the guide grooves 3242 are located to be spaced apart from each other along the second direction 14. The guide grooves 324a prevent the transfer plate 324 and the lift pin 323e from interfering with each other when the substrate W is handed over between the transfer plate 324 and the heating unit 323.

The substrate W is cooled in a state in which the transfer plate 324 having the substrate W placed thereon is brought into contact with the cooling plate 322a. For efficient heat transfer between the cooling plate 322a and the substrate W, the transfer plate 324 is formed of a material having high heat conductivity. In an embodiment, the transfer plate 324 may be formed of a metallic material.

The heating unit 323 provided in some of the heat treatment chambers 320 may supply gas while heating the substrate W to improve the adhesion of the photoresist to the substrate W. In an embodiment, the gas may be hexamethyldisilane (HMIDS) gas.

A plurality of liquid treating chambers 360 are provided. Some of the liquid treating chambers 360 may be stacked one above another. The liquid treating chambers 360 are located on one side of the transfer chamber 350. The liquid treating chambers 360 are arranged side by side along the first direction 12. Some of the liquid treating chambers 360 are located adjacent to the index module 100. Hereinafter, the liquid treating chambers 360 located adjacent to the index module 100 are referred to as front liquid treating chambers 362. Some other liquid treating chambers 360 are located adjacent to the interface module 500. Hereinafter, the liquid treating chambers 360 located adjacent to the interface module 500 are referred to as rear liquid treating chambers 364.

Each of the front liquid treating chambers 362 applies a first liquid onto the substrate W, and each of the rear liquid treating chambers 364 applies a second liquid onto the substrate W. The first liquid and the second liquid may be different types of liquid. In an embodiment, the first liquid may be a liquid for forming an anti-reflection layer, and the second liquid may be a liquid for forming a photoresist layer. The photoresist liquid may be applied onto the substrate W coated with the anti-reflection film. Selectively, the first liquid may be a photoresist liquid, and the second liquid may be a liquid for forming an anti-reflection layer. In this case, the liquid for forming the anti-reflection layer may be applied onto the substrate W coated with photoresist layer. Selectively, the first liquid and the second liquid may be the same kind of liquid, and both the first liquid and the second liquid may be liquids for forming photoresist layer.

The developing block 300b has a same structure with the coating block 300a, and the liquid treating chamber provided to the developing block 300b supplies a developing solution to the substrate W.

The interface module 500 connects the treating module 300 with an external exposure apparatus 700. The interface module 500 has an interface frame 510, an additional process chamber 520, an interface buffer 530, and an interface robot 550.

A fan filter unit that forms a downward air flow may be provided at a top end of the interface frame 510. The additional process chamber 520, the interface buffer 530, and the interface robot 550 are disposed within the interface frame 510. The additional process chamber 520 may perform a predetermined additional process before the substrate W treated in the coating block 300a is transferred to the exposure apparatus 700. Selectively, the additional process chamber 520 may perform a predetermined additional process before the substrate W treated in the exposure apparatus 700 is transferred to the developing block 300b. In an embodiment, the additional process may be an edge exposing process of exposing the edge region of the substrate W, a top side cleaning process of cleaning the top side of the substrate W, or a backside cleaning process of cleaning the backside of the substrate W. A plurality of additional process chambers 520 may be provided, and the additional process chambers 520 may be stacked one above another. All of the additional process chambers 520 may be provided to perform the same process. Selectively, some of the additional process chambers 520 may be provided to perform different processes.

The interface buffer 530 provides a space in which the substrate W transferred between the coating block 300a, the additional process chamber 520, the exposure apparatus 700, and the developing block 300b temporarily stays while being transferred. A plurality of interface buffers 530 may be provided, and the plurality of interface buffers 530 may be stacked one above another.

In an embodiment, the additional process chambers 520 may be disposed on one side of an extension line facing the lengthwise direction of the transfer chamber 350, and the interface buffer 530 may be disposed on an opposite side of the extension line.

The interface robot 550 transfers the substrate W between the coating block 300a, the additional process chamber 520, the exposure apparatus 700, and the developing block 300b. The interface robot 550 may have a transfer hand for transferring the substrate W. One or a plurality of the interface robot 550 may be provided. In an embodiment, the interface robot 550 has a first robot 552 and a second robot 554. The first robot 552 may be provided to transfer the substrate W between the coating block 300a, the additional process chamber 520, and the interface buffer 530, and the second robot 554 may transfer the substrate W between the interface buffer 530 and the exposure apparatus 700, and the second robot 554 may transfer the substrate W between the interface buffer 530 and the developing block 300b.

Each of the first robot 552 and the second robot 554 includes a transfer hand on which the substrate W is placed, and the hand may be provided to be movable forwardly and backwardly, rotatable with respect to an axis parallel to the third direction 16, and movable along the third direction 16.

Hereinafter, a structure of the liquid treating chamber will be described in detail. A liquid treating chamber provided in the coating block will be described as an example. A case in which the liquid treating chamber is a chamber for applying a photoresist on the substrate W will be described as an example. However, the liquid treating chamber may be a chamber forming a protective layer or an anti-reflection layer on the substrate W. The liquid treating chamber may be a chamber for developing the substrate W by supplying a developing liquid to the substrate W.

Figure 10:
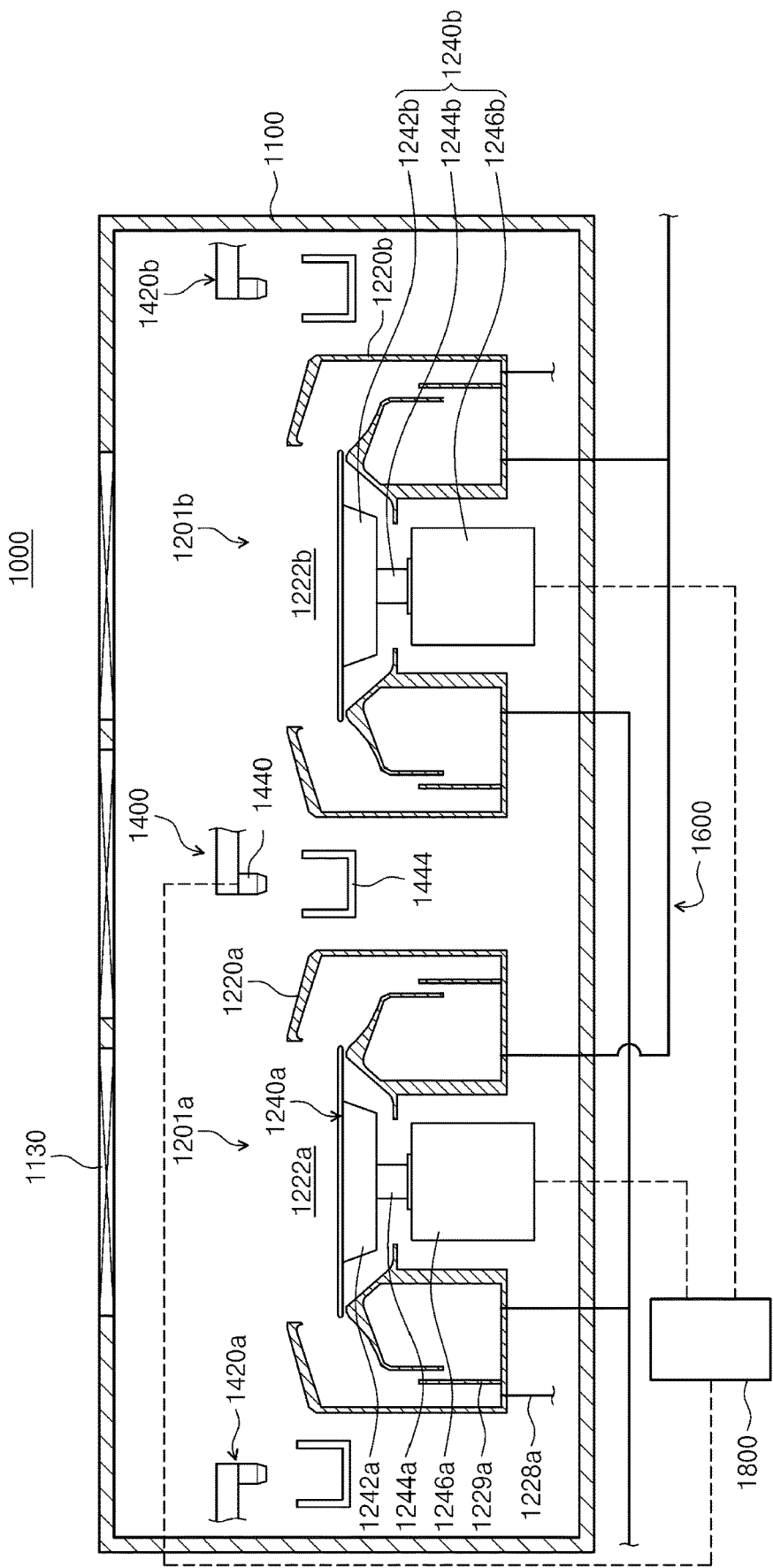
FIG. 10 is a schematic view illustrating an embodiment of a liquid treating chamber of the substrate treating apparatus of FIG. 4.
Figure 11:
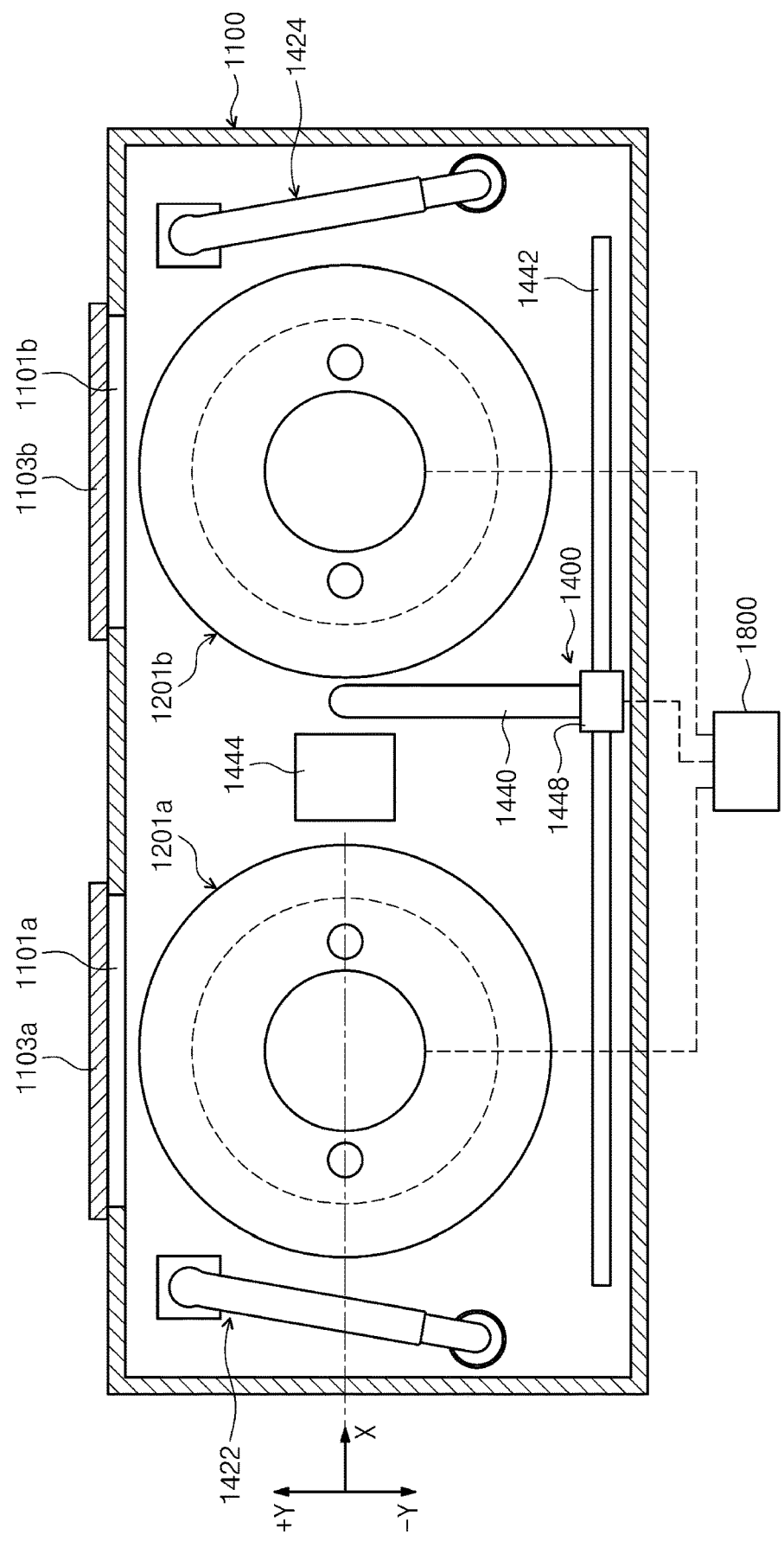
FIG. 11 is a plan view of the liquid treating chamber of FIG. 10.

FIG. 10 is a cross-sectional view illustrating an embodiment of the liquid treating chamber in which a treating liquid is supplied to a rotating substrate W to liquid-treat the substrate W, and FIG. 11 is a plan view of the liquid treating chamber of FIG. 10.

Referring to FIG. 10 and FIG. 11, the liquid treating chamber 1000 includes a housing 1100, a first treating unit 1201a, a second treating unit 1201b, a liquid supply unit 1400, an exhaust unit 1600, and a controller 1800.

The housing 1100 is provided in a rectangular container shape having an inner space. Openings 1101a and 1101b are formed at one side of the housing 1100. The openings 1101a and 1101b function as a passage through which the substrate W is carried in and carried out. At the openings 1101a and 1101b, doors 1103a and 1103b are installed, and the doors 1103a and 1103b open and close the openings 1101a and 1101b.

A fan filter unit 1130 for supplying a downward airflow to the inner space of the housing 1100 is disposed on a top wall of the housing 1100. The fan filter unit 1130 has a fan that introduces outside air into the inner space and a filter that filters external air.

The first treating unit 1201a and the second treating unit 1201b are provided in the inner space of the housing 1100. The first treating unit 1201a and the second treating unit 1201b are arranged in a certain direction. Hereinafter, a direction in which the first treating unit 1201a and the second treating unit 1201b are arranged is referred to as a unit arrangement direction, and is illustrated in the X-axis direction in FIG. 11.

The first treating unit 1201*a* has a first treating container 1220*a* and a first supporting unit 1240*a*.

The first treating container 1220*a* has a first inner space 1222*a*. The first inner space 1222*a* is provided such that a top portion thereof is opened.

The first support unit 1240*a* supports the substrate W in the first inner space 1222*a* of the first treating container 1220*a*. The first support unit 1240*a* has a first support plate 1242*a*, a first drive shaft 1244*a*, and a first driver 1246*a*. The top surface of the first support plate 1242*a* is provided in a disc shape. The first support plate 1242*a* has a diameter smaller than that of the substrate W. The first support plate 1242*a* is provided to support the substrate W by a vacuum pressure. Selectively, the first support plate 1242*a* may have a mechanical clamping structure supporting the substrate W. A first drive shaft 1244*a* is coupled to a center of a bottom of the first support plate 1242*a*, and a first driver 1246*a* is provided with a first drive shaft 1244*a* to provide a rotational force to the first drive shaft 1244*a*. The first driver 1246*a* may be a motor.

The second treating unit 1201*b* has a second treating container 1220*b* and a second supporting unit 1240*b*, and the second supporting unit 1240*b* has a second support plate 1242*b*, a second drive shaft 1244*b*, and a second driver 1246*b*. The second treating container 1220*b* and the second support unit 1240*b* have substantially the same structure as the first treating container 1220*a* and the first support unit 1240*a*.

The liquid supply unit 1400 supplies a liquid onto the substrate W. The liquid supply unit 1400 includes a first nozzle 1420*a*, a second nozzle 1420*b*, and a treating liquid nozzle 1440. The first nozzle 1420*a* supplies the liquid to the substrate W supported on the first support unit 1240*a*, and the second nozzle 1420*b* supplies the liquid to the substrate W supported on the second support unit 1240*b*. The first nozzle 1420*a* and the second nozzle 1420*b* may be provided to supply the same type of liquid. According to an embodiment, the first nozzle 1420*a* and the second nozzle 1420*b* may supply a rinsing liquid for cleaning the substrate W. For example, the rinsing liquid may be water. According to another embodiment, the first nozzle 1420*a* and the second nozzle 1420*b* may supply a removing liquid for removing a photoresist from an edge region of the substrate W. For example, the removing liquid may be a thinner. Each of the first nozzle 1420*a* and the second nozzle 1420*b* may rotate about its axis between a process position and a standby position. The process position is a position at which the liquid is discharged from the substrate W, and the standby position is a position at which the first nozzle 1420*a* and the second nozzle 1420*b* respectively wait on the substrate W without discharging the liquid.

The treating liquid nozzle 1440 supplies the treating liquid to the substrate W supported on the first support unit 1240*a* and the substrate W supported on the second support unit 1240*b*. The treating liquid may be a photoresist. The nozzle driver 1448 drives the treating liquid nozzle 1440 so that the treating liquid nozzle 1440 is moved between a first process position, the standby position, and a second process position along the guide 1442. The first process position is a position for supplying the treating liquid to the substrate W supported on the first support unit 1240*a*, and the second process position is a position for supplying the treating liquid to the substrate W supported on the second support unit 1240*b*. The standby position is a position to wait at the standby port 1444 located between the first treating unit 1201*a* and the second treating unit 1201*b* when the photoresist is not discharged from the treating liquid nozzle 1440.

A gas-liquid separation plate 1229*a* may be provided in the inner space 1222*a* of the first treating container 1220*a*. The gas-liquid separation plate 1229*a* may be provided to upwardly extend from a bottom wall of a first treating container 1220*a*. The gas-liquid separation plate 1229*a* may be provided in a ring shape.

According to an embodiment, an outer side of the gas-liquid separation plate 1229*a* may be provided as a discharge space for liquid emission, and an inner side of the gas-liquid separation plate 1229*a* may be provided as an exhaust space for atmospheric exhaustion. A discharge pipe 1228*a* for discharging a treating liquid is connected to the bottom wall of the first treating container 1220*a*. The discharge pipe 1228*a* discharges the treating liquid introduced between a sidewall of the first treating container 1220*a* and the gas-liquid separation plate 1229*a* to the outside of the first treating container 1220*a*. An air flow flowing into a space between a side wall of the first treating container 1220*a* and the gas-liquid separation plate 1229*a* flows into the gas-liquid separation plate 1229*a*. In this process, the treating liquid contained in the air flow is discharged from the discharge space to the outside of the first treating container 1220*a* through the discharge pipe 1228*a*, and the air flow is introduced into an exhaust space of the first treating container 1220*a*.

Although not shown, a lifting/lowering driver for adjusting relative heights between the first support plate 1242*a* and the first treating container 1220*a* may be provided.

Figure 12:
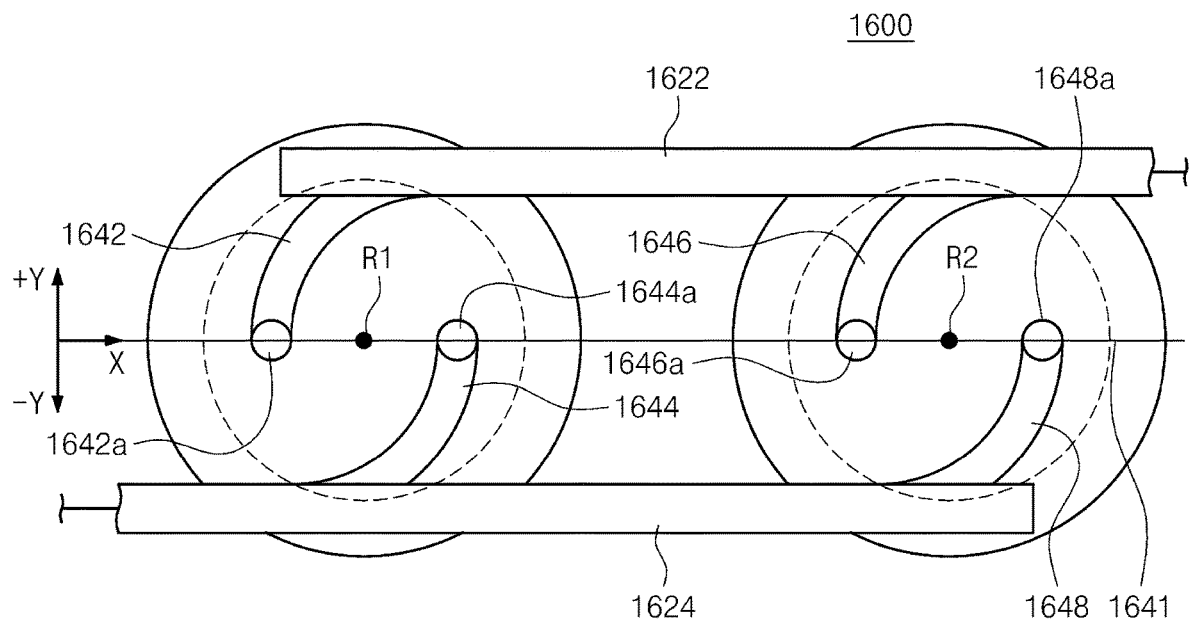
FIG. 12 is a schematic view illustrating a treating of the substrate at the liquid treating chamber.

FIG. 12 is a plan view schematically illustrating an example of the exhaust unit 1600. Referring to FIG. 12, the exhaust unit 1600 has a first common duct 1622, a second common duct 1624, a first exhaust line 1642, a second exhaust line 1644, a third exhaust line 1646, and a fourth exhaust line 1648.

The first common duct 1622 is disposed on a first side, and the second common duct 1624 is disposed on a second opposite side. For example, the first common duct 1622 and the second common duct 1624 are spaced apart from each other with disposing a rotation center of the first and second support plates therebetween In FIG. 12, when the unit arrangement direction passing the rotation centers R1 and R2 is the X axis, the first common duct 1622 is located above the X axis, i.e., in a +Y axis direction, and the second common duct 1624 is located below the X axis, i.e., in a −Y axis direction. Each of the first common duct 1622 and the second common duct 1624 may be provided such that their lengthwise direction is substantially parallel to the unit arrangement direction.

The first exhaust line 1642 and the second exhaust line 1644 are coupled to the first treating container 1220*a* to exhaust the atmosphere from the first inner space 1222*a* of the first treating container 1220*a*. The first exhaust line 1642 has a first exhaust port 1642*a* introducing the atmosphere of the first inner space 1222*a*, and the second exhaust line 1644 has a second exhaust port 1644*a* introducing the atmosphere of the first inner space 1222*a*. According to an embodiment, the first exhaust line 1642 and the second exhaust line 1644 may be coupled to a bottom wall of the first treating container 1220*a*.

According to an embodiment, when viewed from above, the first exhaust port 1642*a* and the second exhaust port 1644*a* may be located such that a virtual linear line 1641 (e.g., a straight line) connecting the first exhaust port 1642*a* and the second exhaust port 1644*a* passes through a rotation center R1 of the first support plate 1242*a*. The first exhaust line 1642 is located above the linear line 1641, in the +Y axis. According to an embodiment, the first exhaust line 1642 is provided in a circular arc shape. The first exhaust line 1642 may be formed to have the same center as the rotation center R1 of the first support plate 1242a. For example, the first exhaust line 1642 may have a central angle of 90 degrees, and as shown in FIG. 12, the first exhaust line 1642 may be located in a second quadrant with respect to the rotation center R1 of the first support plate 1242a.

The second exhaust line 1644 is located below the linear line 1641, in the −Y axis. The second exhaust line 1644 is connected to the second common duct 1624, and the atmosphere of the first inner space 1222a introduced through the second exhaust port 1644a is guided to the second common duct 1624. According to an example, the second exhaust line 1644 is provided in a circular arc shape. The second exhaust line 1644 may be formed to have the same center as the rotation center R1 of the first support plate 1242a. For example, the second exhaust line 1644 may be provided with a central angle of 90 degrees, and as shown in FIG. 12, may be located in a fourth quadrant with respect to the rotation center R1 of the first support plate 1242a.

According to an embodiment, the first exhaust line 1642 and the second exhaust line 1644 may be disposed and formed to have a point-symmetrical with respect to the rotation center R1 of the first support plate 1242a when viewed from above.

The third exhaust line 1646 and the fourth exhaust line 1648 are coupled to the second treating container 1220b to exhaust the atmosphere from the second inner space 1222b of the second treating container 1220b. The third exhaust line 1646 has a third exhaust port 1646a introducing an atmosphere of the second inner space 1222b, and the fourth exhaust line 1648 has a fourth exhaust port 1648a introducing the atmosphere of the second inner space 1222b. According to an embodiment, the third exhaust line 1646 and the fourth exhaust line 1648 may be coupled to the bottom wall of the second treating container 1220b.

According to an embodiment, a third exhaust port 1646a and a fourth exhaust port 1648a may be located such that a virtual linear line 1641 connecting the third exhaust port 1646a and the fourth exhaust port 1648a passes through a rotation center R2 of the second support plate 1242b when seen from above. The third exhaust line 1646 is located above the linear line 1641, in the +Y axis. According to an embodiment, the third exhaust line 1646 is provided in a circular arc shape. The third exhaust line 1646 may be formed to have the same center as the rotation center R2 of the second support plate 1242b. For example, the third exhaust line 1646 may be provided with a central angle of 90 degrees, and as shown in FIG. 12, may be located in a second quadrant with respect to the rotation center R2 of the second support plate 1242b.

The fourth exhaust line 1648 is located below the linear line 1641, in the −Y axis. The fourth exhaust line 1648 is connected to the second common duct 1624, and the atmosphere of the second inner space 1222b introduced through the fourth exhaust port 1648a is guided to the second common duct 1624. According to an embodiment, the fourth exhaust line 1648 is provided in a circular arc shape. The fourth exhaust line 1648 may be formed to have the same center as the rotation center R2 of the second support plate 1242b. For example, the fourth exhaust line 1648 may have a central angle of 90 degrees and may be located in the fourth quadrant with respect to the rotation center R2 of the second support plate 1242b as shown in FIG. 12.

According to an embodiment, the third exhaust line 1646 and the fourth exhaust line 1648 may be disposed and shaped to have a point-symmetrical with respect to the rotation center R2 of the second support plate 1242b when viewed from above.

The first exhaust line 1642 may have a main line and an inlet part. The first exhaust port 1642a may be provided at one end of the inlet part, and the main line may be provided to extend from the other end of the inlet part. The inlet part may be provided perpendicular to the bottom wall of the first treating container 1220a, and the main line may be provided generally parallel to the bottom wall of the first treating container 1220a. The inlet part may be provided to have a relatively short length compared to the main line. The first exhaust port 1642a may be provided at a position upwardly spaced apart from the bottom wall of the first treating container 1220a. Selectively, the first exhaust port 1642a may be provided at the same height as the bottom wall of the first treating container 1220a. Selectively, the first exhaust port 1642a is provided at the same height as the bottom wall of the first treating container 1220a, and at the same time, the first exhaust line 1642 may have only a main line without an inlet part. In this case, the first exhaust line 1642 may be in contact with the bottom wall of the first treating container 1220a, and the first exhaust port 1642a may be formed in the first exhaust line 1642. The second exhaust line 1644, the third exhaust line 1646, and the fourth exhaust line 1648 may have the same shape and structure as the first exhaust line 1642.

In the above-described example, the virtual linear line 1641 connecting the third exhaust port 1646a and the fourth exhaust port 1648a may be the same linear line 1641 connecting the first exhaust port 1642a and the second exhaust port 164a. For example, the first exhaust port 1642a, the second exhaust port 1644a, the third exhaust port 1646a, and the fourth exhaust port 1648a may be sequentially disposed on the virtual linear line 1641.

Although not illustrated, each of the first common duct 1622 and the second common duct 1624 may be provided with a decompression member providing a flow pressure for exhaust. For example, the decompression member may be a pump or a fan. The first common duct 1622 is provided to exhaust from the first exhaust port 1642a along the rotation direction of the first support plate 1242a, and the second common duct 1624 is provided to exhaust from the second exhaust port 1644a along the rotation direction of the first support plate 1242a. Furthermore, the first common duct 1622 is provided to exhaust from the third exhaust port 1646a along the rotation direction of the second support plate 1242b, and the second common duct 1624 is provided to exhaust from the fourth exhaust port 1648a along the rotation direction of the second support plate 1242b. Accordingly, a direction in which the exhaust is performed in the first common duct 1622 and a direction in which the exhaust is performed in the second common duct 1624 may be provided opposite to each other. For example, in the arrangement in FIG. 12, the exhaust direction in the first common duct 1622 is left to right while the exhaust direction in the second common duct 1624 is right to left. Accordingly, a flow of exhaust to the first common duct 1622 through the first exhaust line 1642 and the third exhaust line 1646 may be smoothly provided, and a flow of exhaust to the second common duct 1624 through the second exhaust line 1644 and the fourth exhaust line 1648 may be smoothly provided.

In the aforementioned example, the decompression member was provided in each of the first common duct 1622 and the second common duct 1624, but the first common duct 1622 and the second common duct 1624 may be combined into one line and a decompression member may be provided in the combined line.

Figure 13:
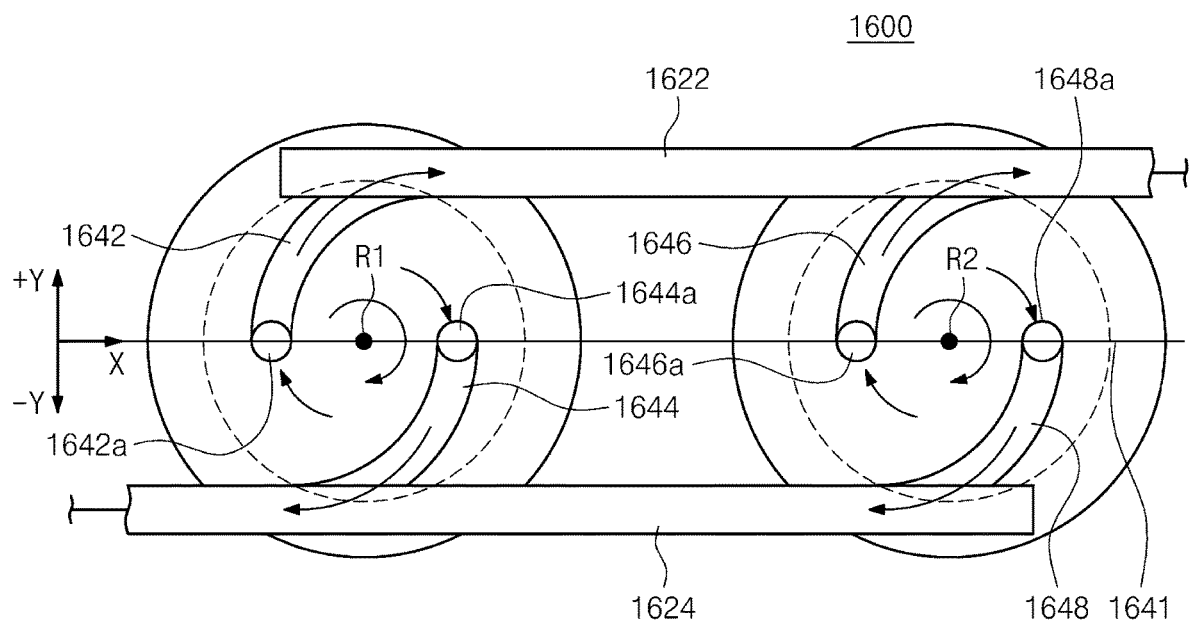
FIG. 13 shows a flow path of an air flow when the substrate is treated at the liquid treating chamber of FIG. 10.
Figure 14:
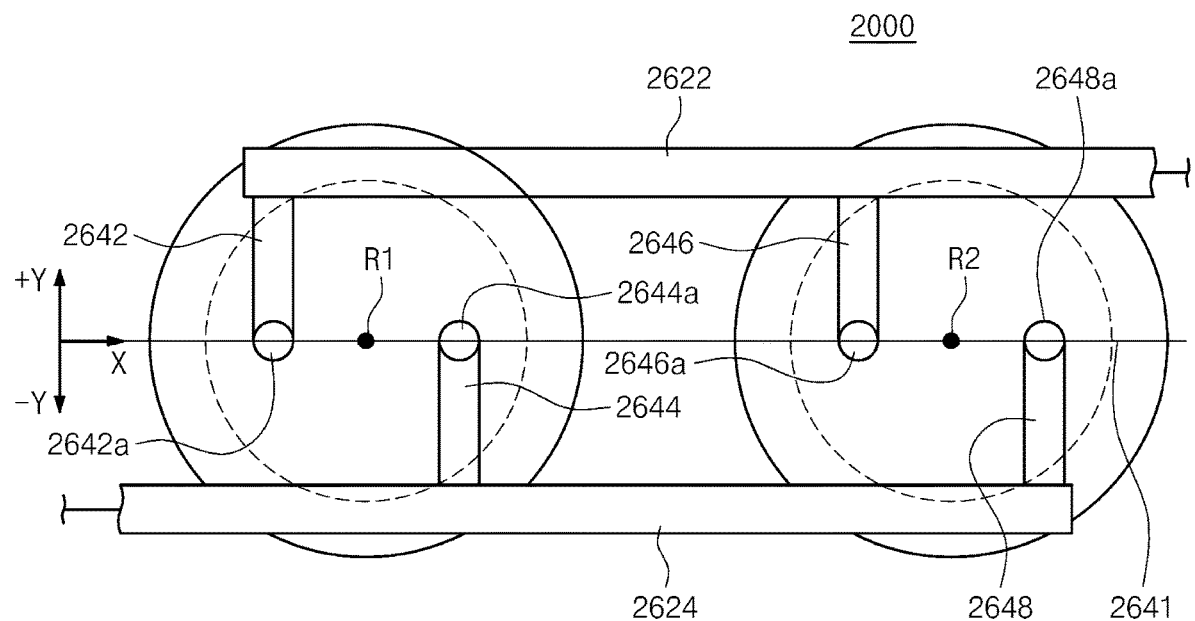
FIG. 14 to FIG. 17 are views illustrating modified embodiments of the liquid treating chamber of FIG. 11, respectively.

The controller 1800 controls the first treating unit 1201a, the second treating unit 1201b, and the liquid supply unit 1400. When a first substrate W is placed on the first support unit 1240a, the treating liquid nozzle 1440 is moved to the first process position. The controller 1800 controls the first support unit 1240a to rotate the first substrate W, and controls the liquid supply unit 1400 to discharge a photoresist from the treating liquid nozzle 1440 to the first substrate W placed on the first support unit 1240a. In this case, the controller 1800 controls the support unit 1240 such that an exhaust direction exhausted from the first inner space 1222a in the first exhaust line 1642 and the second exhaust line 1644 is a forward direction (easy flow direction) with respect to the rotation direction of the first substrate W. Thereafter, when a second substrate W is placed on the second support unit 1240b, the treating liquid nozzle 1440 is moved to the second process position. The controller 1800 controls the second support unit 1240b to rotate the second substrate W, and controls the liquid supply unit 1400 to discharge the photoresist from the treating liquid nozzle 1440 to the second substrate W placed on the second support unit 1240b. In this case, the controller 1800 controls the support unit 1240 such that the exhaust flow of the atmosphere exhausted from the second inner space 1222b in the third exhaust line 1646 and the fourth exhaust line 1648 is a forward direction with respect to the rotation direction of the second substrate W. When the exhaust unit 1600 is provided as shown in FIG. 12, the first substrate W and the second substrate W are rotated clockwise, respectively, as shown in FIG. 13.

While the treating liquid nozzle 1440 discharges the photoresist from one of the first treating unit 1201a or the second treatment unit 1201b, a rinse liquid or a removing liquid may be discharged from the first nozzle 1420a or the second nozzle 1420b in the other.

Figure 2:
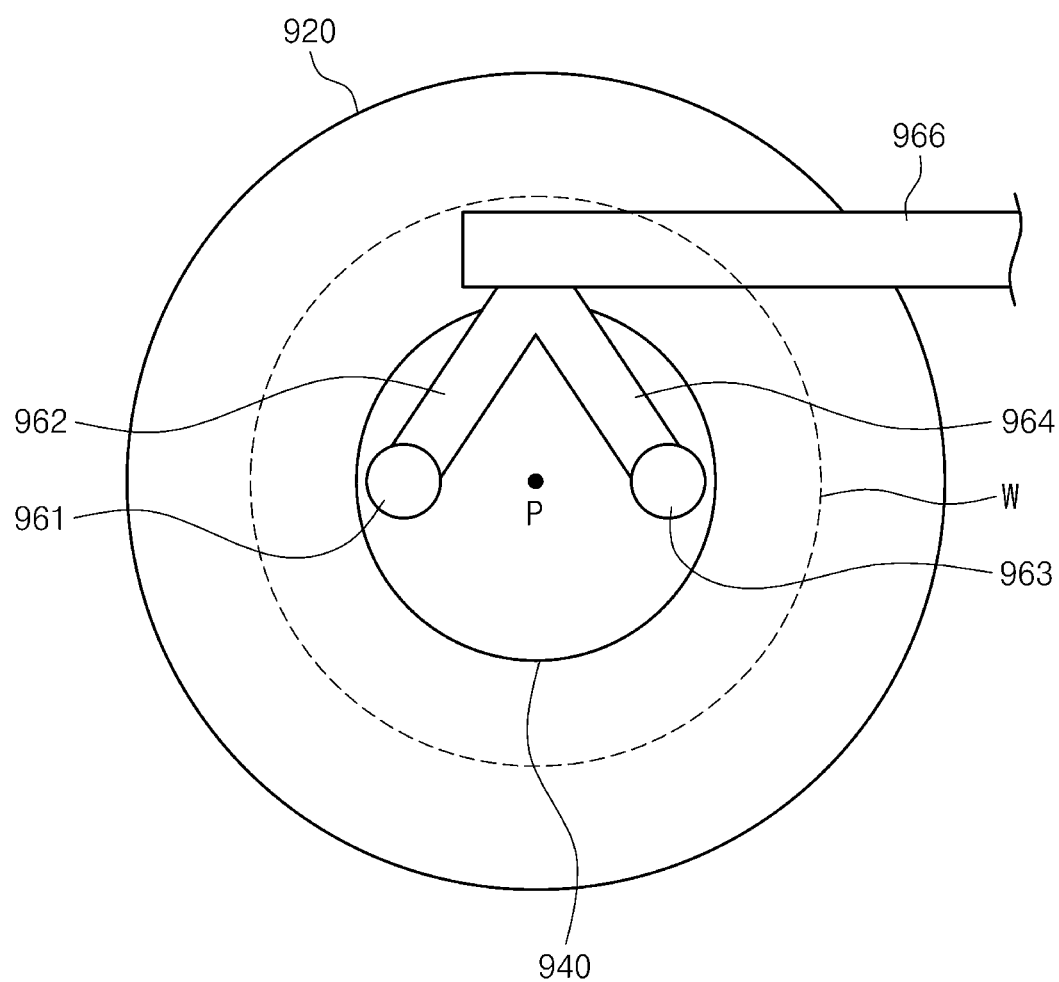
FIG. 2 is a plan view illustrating an exhaust unit of the substrate treating apparatus of FIG. 1.
Figure 3:
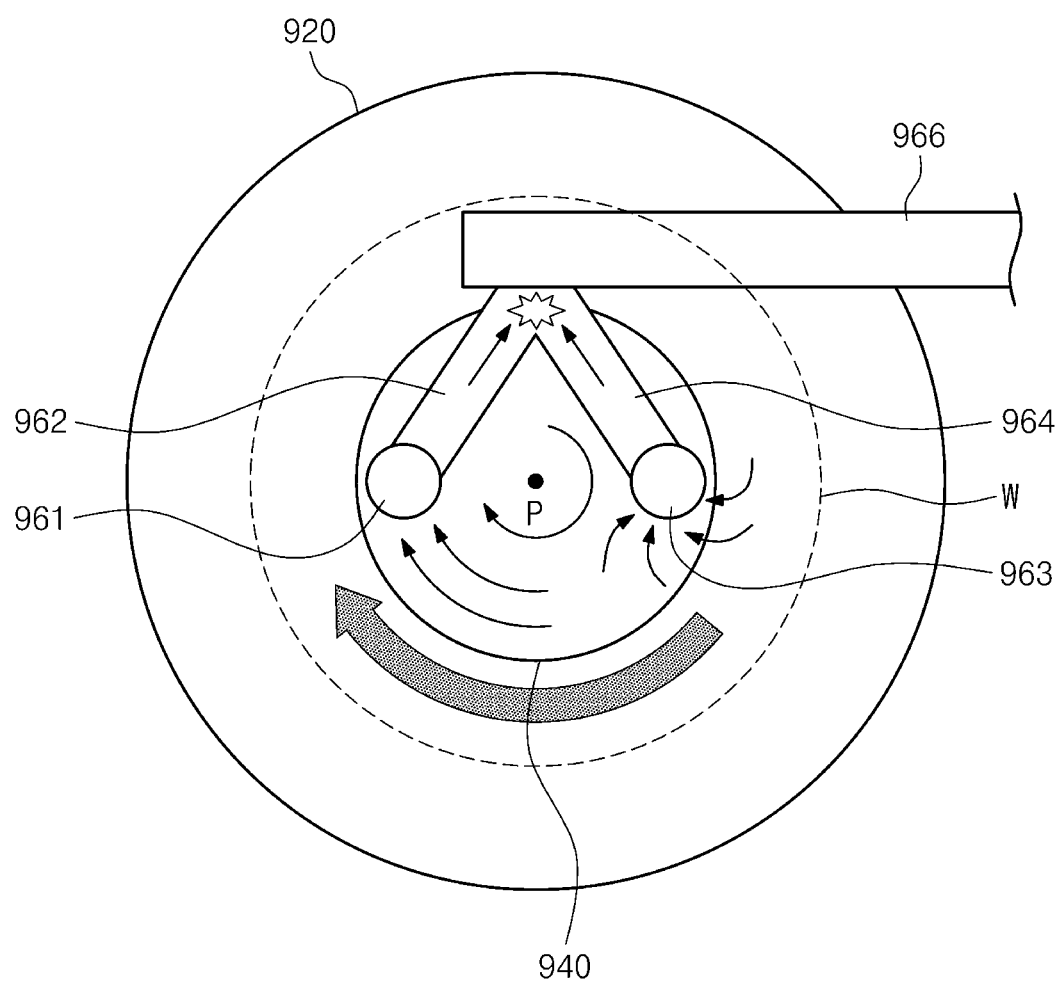
FIG. 3 is a view illustrating an air flow during a treating of the substrate using the substrate treating apparatus of FIG. 1.

During a processing at the treating units 1201a and 1201b, rotation airflow is generated in the inner spaces 1222a and 1222b of the treating units 1201a and 1201b by rotation of the substrate W and the support plates 1242a and 1242b. When the apparatus having an exhaust unit 1600 as shown in FIG. 2 is used, the exhaust flow to some of the exhaust lines is not smooth, but when the apparatus having the exhaust unit 1600 as in the embodiment of the inventive concept is used, all the exhaust lines 1642, 1644, 1646, and 1648 have a smooth exhaust flow.

In the above examples, the first to fourth exhaust lines 1642, 1644, 1646, and 1648 are illustrated as having a circular arc shape, respectively. However, unlike this, as illustrated in the liquid treating chamber 2000 of FIG. 14, the first to fourth exhaust lines 2642, 2644, 2646 and 2648 may be provided in a linear line, respectively. In this case, the first to fourth exhaust lines 2642, 2644, 2646, and 2648 may be provided perpendicular to the virtual linear line 2641 connecting the first to fourth exhaust ports 2642a, 2644a, 2646a, and 2648a, respectively, when viewed from above.

Figure 15:
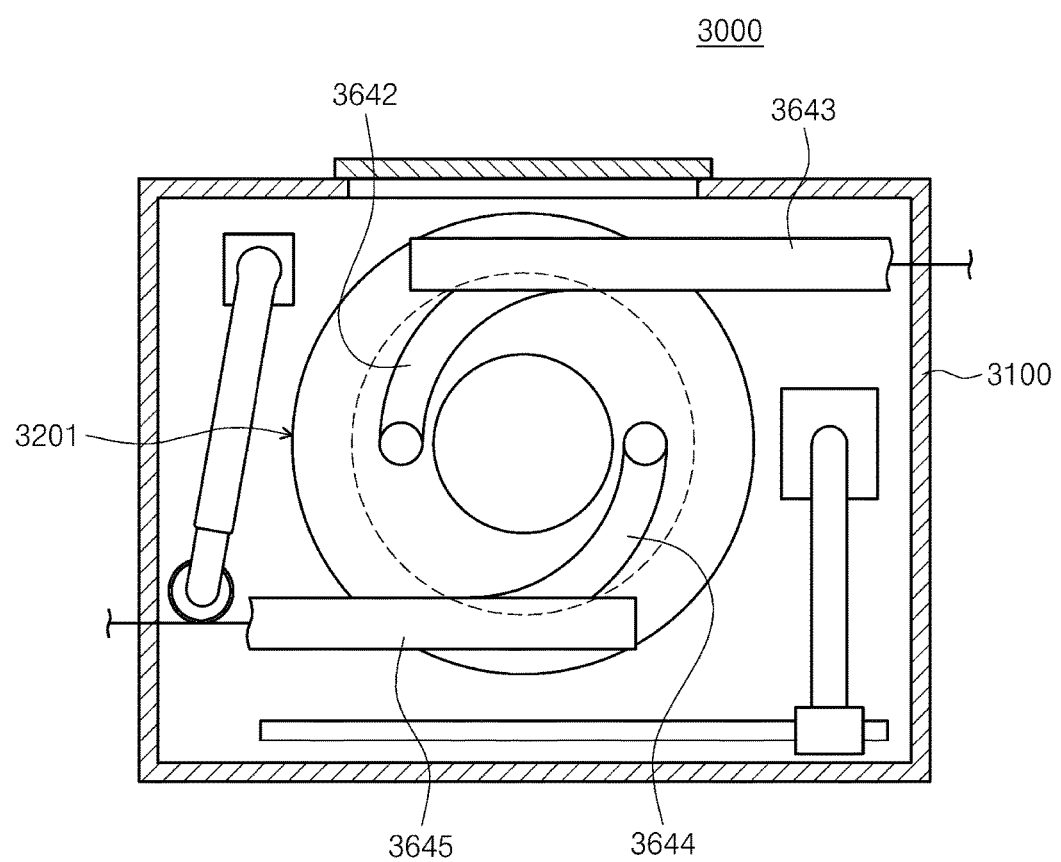

In the above-described example, two treating units 1201a and 1201b are provided in the housing 1100 of the liquid treating chamber 1000 for liquid treatment of the substrate W, and the treating liquid nozzles 1440 are commonly used in the two treating units 1201a and 1201b. However, unlike this, as shown in FIG. 15, only one treating unit 3201 may be provided in the housing 3100 of the liquid treating chamber 3000. In this case, a first extension line 3643 extending from the first exhaust line 3642 and having the decompression member (not shown) may be provided instead of the first common duct, and a second extension line 3645 extending from the second exhaust line 3644 and having the decompression member (not shown) may be provided instead of the second common duct.

Figure 16:
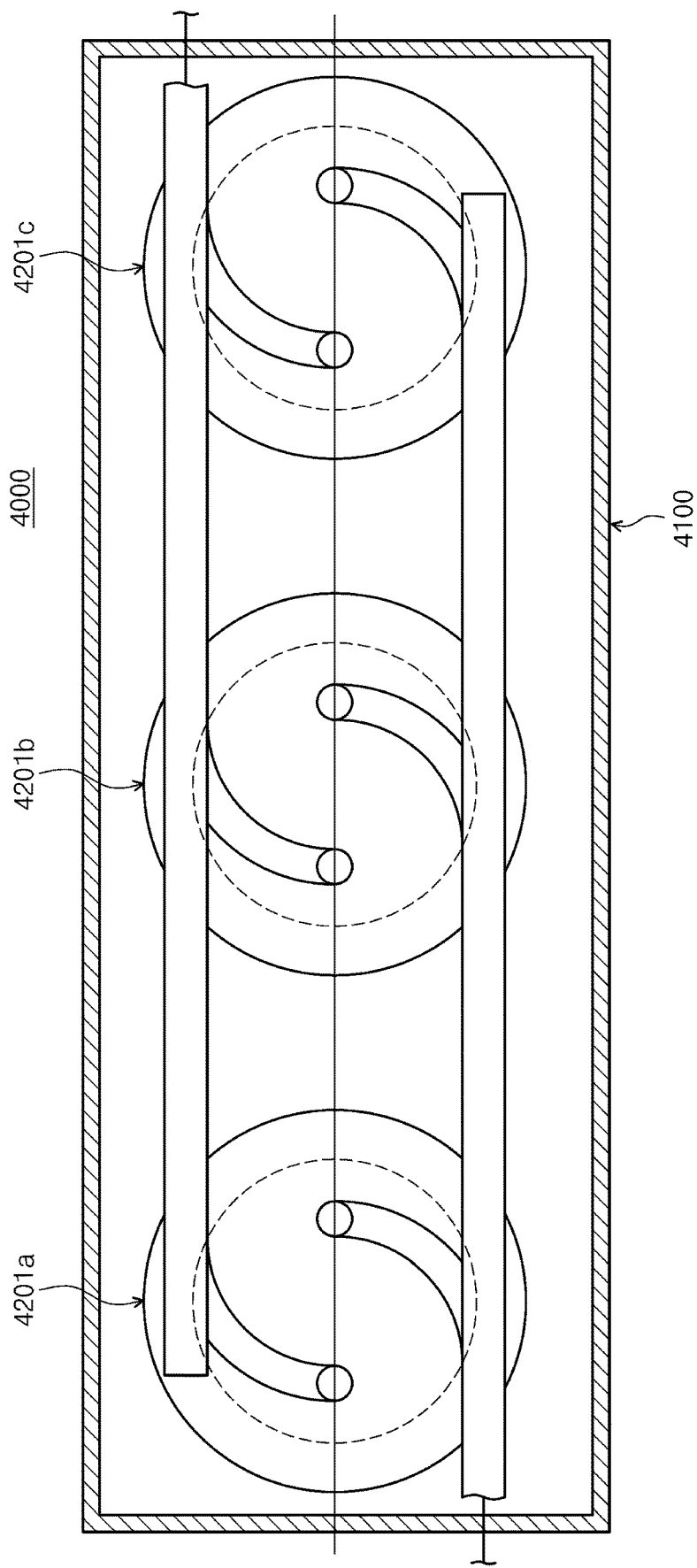

Selectively, as illustrated in FIG. 16, three or more treating units 3201a, 3201b, 3201c may be provided in the housing 4100 of the liquid treating chamber 4000.

Figure 17:
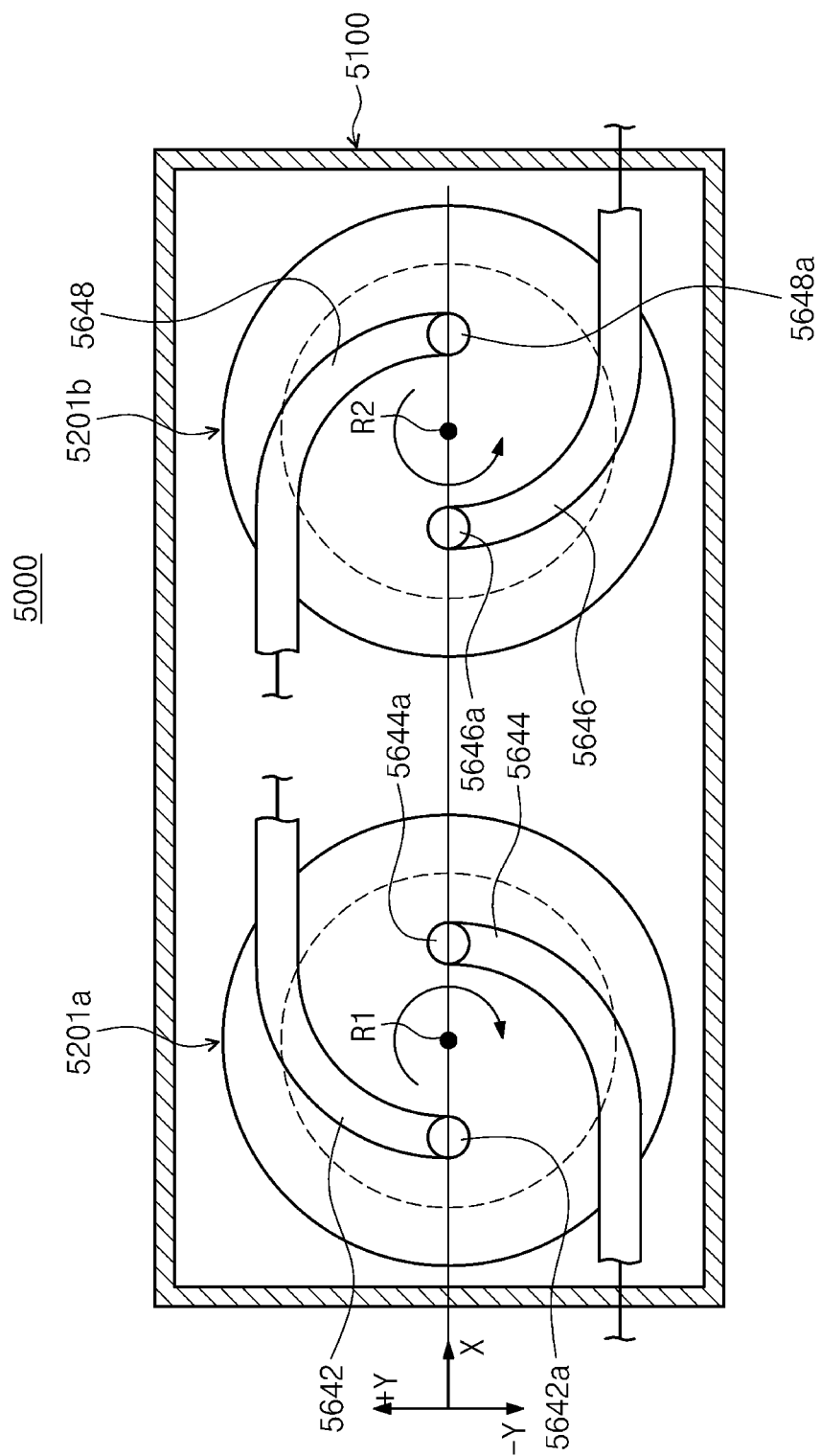

Selectively, as illustrated in FIG. 17, the first treating unit 5201a and the second treating unit 5201b are provided in the housing 5100 of the liquid treating chamber 5000, and the rotation direction of the substrate W during the processing at the first treating unit 5201a and the second treating unit 5201b may be opposite to each other. In this case, the first exhaust line 5642 and the second exhaust line 5644 coupled to the first treating unit 5201a, and the third exhaust line 5646 and the fourth exhaust line 5648 coupled to the second treating unit 520b are respectively located and formed so that an exhaust flow may occur in a forward direction with respect to the rotation direction of the substrate W.

For example, in the first treating unit 5201a, the substrate W may be rotated in a clockwise direction, in the second treating unit 5201b, the substrate W may be rotated in a counterclockwise direction, and the first exhaust port 5642a, the second exhaust port 5644a, the third exhaust port 5646a, and the fourth exhaust port 5648a may be sequentially arranged along the unit arrangement direction X. In this case, as shown in FIG. 17, the first exhaust line 5642 and the fourth exhaust line 5648 may be located at one side +Y with respect to the unit arrangement direction X, and the second exhaust line 5644 and the third exhaust line 5646 may be located at the other side −Y with respect to the unit arrangement direction X.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

What is claimed is:
1. An apparatus for treating a substrate comprising:
a first treating unit for treating the substrate including a first treating container having a first inner space and a first support unit supporting and rotating the substrate in the first inner space;
a second treating unit for treating the substrate including a second treating container having a second inner space and a second support unit supporting and rotating the substrate in the second inner space; and
an exhaust unit exhausting the first inner space and the second inner space,
wherein the first treating unit and the second treating unit are arranged in a line, wherein the exhaust unit comprises:

a first common duct located at a first side of a unit arrangement direction defined by the arrangement of the first treating unit and the second treating unit;

a second common duct located at a second side of the unit arrangement direction opposite the first side;

a first exhaust line having a first exhaust port introducing an atmosphere of the first inner space and exhausting an atmosphere introduced into the first exhaust port through the first common duct;

a second exhaust line having a second exhaust port introducing an atmosphere of the first inner space and exhausting an atmosphere introduced into the second exhaust port through the second common duct;

a third exhaust line having a third exhaust port introducing an atmosphere of the second inner space and exhausting an atmosphere introduced into the third exhaust port through the first common duct; and a fourth exhaust line having a fourth exhaust port introducing an atmosphere of the second inner space and exhausting an atmosphere into the fourth exhaust port through the second common duct, wherein, when viewed in a plan view, each of the first exhaust line, the second exhaust line, the third exhaust line, and the fourth exhaust line is provided in a circular arc shape, wherein the first exhaust line and the second exhaust line are coupled to a bottom wall of the first treating container, and wherein the first exhaust line and the second exhaust line overlap the first treating container of the first treating unit when viewed in the plan view.

2. The apparatus of claim 1, further comprising:

a controller configured to control the first support unit and the second support unit such that an exhaust direction inside of the first exhaust line, the second exhaust line, the third exhaust line, and the fourth exhaust line becomes a forward direction with respect to a rotation direction of the substrate.

3. The apparatus of claim 1, wherein the first support unit comprises:

a first support plate supporting the substrate;

a first drive shaft coupled to the first support plate; and a first driver rotating the first drive shaft, wherein the first exhaust line and the second exhaust line have a point symmetry with a rotation center of the first support plate when seen from above, and the second support unit comprises:

a second support plate supporting the substrate;

a second drive shaft coupled to the second support plate; and a second driver rotating the second drive shaft, wherein the third exhaust line and the fourth exhaust line have a point symmetry with respect to a rotation center of the second support plate when seen from above.

4. The apparatus of claim 1, wherein the first exhaust port, the second exhaust port, the third exhaust port, the fourth exhaust port are sequentially aligned along the unit arrangement direction.

5. The apparatus of claim 1, further comprising:

a controller configured to control the first support unit and the second support unit such that a substrate supported by the first support unit and a substrate supported by the second support unit rotate in the same direction.

6. The apparatus of claim 1 further comprising a liquid supply unit discharging a liquid on the substrate, wherein the liquid supply unit comprises:

a nozzle; and a nozzle driver moving the nozzle to a first process position opposing the liquid supply unit or a second process position opposing the second support unit such that the nozzle discharges the liquid to a selected substrate among a substrate supported by the first support unit or a substrate supported by the second support unit.

* * * * *